(12) United States Patent
Yasugi et al.

(10) Patent No.: US 6,501,667 B2
(45) Date of Patent: Dec. 31, 2002

(54) DATA WRITING SYSTEM

(75) Inventors: Hiroyuki Yasugi, Tottori (JP); Junichi Kawakami, Tottori (JP); Shuhei Abe, Tottori (JP); Koji Mantani, Tottori (JP)

(73) Assignee: Ricoh Microelectronics Company, Ltd., Tottori (JP)

( * ) Notice: Subject to any disclaimer, the term of this patent is extended or adjusted under 35 U.S.C. 154(b) by 7 days.

(21) Appl. No.: 09/897,109

(22) Filed: Jul. 3, 2001

(65) Prior Publication Data

US 2002/0073271 A1 Jun. 13, 2002

(30) Foreign Application Priority Data

Aug. 28, 2000 (JP) .......................... 2000-257235

(51) Int. Cl.$^7$ .............................. G11C 5/02; G06F 12/00
(52) U.S. Cl. .............................. 365/51; 365/52; 711/103
(58) Field of Search .............................. 365/51, 52, 63; 711/103, 102

(56) References Cited

U.S. PATENT DOCUMENTS 5,296,692 A * 3/1994 Shino .......................... 235/486
6,157,559 A * 12/2000 Yoo .............................. 365/52
6,415,393 B2 * 7/2002 Satoh .......................... 714/30

* cited by examiner

*Primary Examiner*—Son T. Dinh
(74) *Attorney, Agent, or Firm*—Oblon, Spivak, McClelland, Maier & Neustadt, P.C.

(57) ABSTRACT

A data writing system capable of writing data in at least one electrically rewritable ROM mounted on target board, comprising: a transportation unit for transporting the target board to a predetermined writing position at which data is to be written, a data writing unit for writing data in the ROM mounted on the target board, and a connection unit for electrically connecting the ROM mounted on the target board at the predetermined writing position with the data writing unit through at least one transmission line extending from the ROM.

9 Claims, 7 Drawing Sheets

DATA WRITING SYSTEM

BACKGROUND OF THE INVENTION

1. Field of the Invention

The present invention relates to a data writing system capable of writing data in an electrically rewritable ROM (Read Only Memory) mounted on a target board such as a printed circuit board used, for example, as a facsimile control board.

2. Discussion of Background

As the electrically rewritable ROM, there are known, for example, EEPROM (Electric Erasable Programmable ROM) and flash memory, from which data written therein can be electrically erased and in which written data can be electrically rewritten.

Conventionally, when data is written in such a ROM, the ROM is attached to a ROM writer, without being mounted on a printed circuit board, that is, in the form of a single part, and when the data writing is finished, the data written ROM is mounted on a circuit board by soldering.

In such a data writing method, however, when the data written ROM is detached from the ROM writer, there is a risk that leads extending from the ROM are bent and improper soldering takes place.

In order to eliminate such a risk, in Japanese Laid-Open Patent Application No. 9-274798, there is proposed a method of writing program data in an electrically rewritable ROM mounted on a printed circuit board by use of a particular ROM writer. According to this method, after the ROM is mounted on the printed circuit board, the program data is written in the ROM, so that there is not the step of detaching the ROM from the ROM writer as in the above-mentioned conventional method and therefore, there is no risk that the leads thereof are bent.

However, in the data writing method proposed in Japanese Laid-Open Patent Application No. 9-274798, the ROM mounted printed circuit board is manually attached to the data writing unit for electrically connecting the ROM to the data writing unit by an operator, and this manual operation by the operator increases the production cost for writing program data in the ROM mounted on the printed circuit board.

SUMMARY OF THE INVENTION

It is therefore an object of the present invention to provide a data writing system capable of writing data in an electrically rewritable ROM (Read Only Memory) mounted on a target board, without the necessity for the operator who manually connects the ROM mounted on a printed circuit board to the data writing unit, thereby reducing the production cost of the data written ROM mounted on the target board, which can be used, for example, as a facsimile control printed circuit board.

The above object of the present invention can be achieved by a data writing system capable of writing data in at least one electrically rewritable ROM mounted on a target board, comprising:

a transportation unit for transporting the target board to a predetermined writing position at which data is to be written in the ROM, a data writing unit for writing data in the ROM mounted on the target board, and a connection unit for electrically connecting the ROM mounted on the target board at the predetermined writing position and the data writing unit through at least one transmission line extending from the ROM.

In the above data writing system, the ROM mounted on the target board is transported to a predetermined writing position by the transportation unit, and at the predetermined writing position, the ROM and the data writing unit are electrically connected through the connection unit, so that the data writing unit can write data in the ROM mounted on the target board through the connection unit.

Thus, according to the present invention, the connection operation can be automatically carried out by the connection unit without the necessity for the operator, in contrast to the conventional connection operation which is conducted manually by an operator.

The connection unit can be constructed either separately form the data writing unit or integrally with the data writing unit.

When the connection unit is constructed separately from the data writing unit, data writing can be carried out without changing the structure of the data writing unit by using a connection unit suitable for the kind of ROM employed and the position of the ROM on the target board.

In the above data writing system of the present invention, the connection unit may comprise a contact member which comes into contact with the transmission line extending from the ROM, so that through the contact member and the transmission line, the ROM can be electrically connected to the data writing unit.

In order to electrically connect the connection unit to the ROM mounted on the target board, for example, there can be devised a method of connecting a connector provided at the connection unit to a connector provided at the target board. This method, however, has the problems that high positional accuracy is required for the connectors in order to connect the two connectors, and high pressing force is also required for inserting one connector in another connector, which hinders smooth connection of the two connectors.

In order to eliminate the above problems, in the data writing system of the present invention, the contact member, which comes into contact with the transmission line extending from the ROM, is provided in the connection unit, whereby through the contact member and the transmission line, the ROM is electrically connected to the data writing unit. In this structure, the connection can be smoothly carried out without any substantial load.

The transmission line extending from the ROM, with which the contact member comes into contact, includes, for example, electric wires on the target board, extending from the ROM, leads of the ROM, and connector terminals provided on the target board.

In the above data writing system of the present invention, the connection unit may also comprise a plurality of contact members through which the connection unit is capable of electrically connecting to a plurality of connection points of the transmission line extending from the ROM, so that through the transmission line and the contact members, the ROM is electrically connected to the data writing unit.

When the contact member of the connection unit is electrically connected to the ROM mounted on the target board which has been transported to a predetermined position by the transportation unit, there is a risk that connection failure takes place between the contact member and the ROM. When such connection failure takes place, proper data writing cannot be carried out, so that the data writing has to be done over again. This will reduce the production efficiency.

In order to prevent this problem, in the data writing system of the present invention, the connection unit can comprise a plurality of contact members, so that the connection unit is electrically connected to a plurality of connection points of the same transmission line extending from the ROM, whereby the data to be written is transmitted from the data writing unit to the ROM mounted on the target board through a plurality of transmission routes. Therefore, even if some connection failure occurs in one transmission route between the connection unit and the ROM mounted on the target board and therefore data transmission becomes impossible through the transmission route, the data transmission to the ROM can be carried out through the other transmission routes. This will reduce the doing over the data transmission due to the above-mentioned connection failure.

In the above data writing system of the present invention, at least part of the plurality of the contact members may come into contact with the same transmission line from both sides, a front side and a back side, of the target board.

The above data writing system is constructed so as to cause the plurality of the contact members to come into contact with the same transmission line extending from the ROM from both sides of the target board. In other words, the contact members are disposed so as to hold the target board therebetween and come into contact with the same transmission line on the target board. In this structure, even if the contact members disposed on one side of the target board are not in proper contact with the transmission line due to the deposition of a flux or foreign materials thereon, the contact members on the other side of the target board can secure transmission routes to the transmission line, whereby there can be reduced the doing over the data transmission which is caused by the above-mentioned connection failure.

Furthermore, in the above-mentioned data writing system of the present invention, the connection unit may comprise:
   a contact member which electrically comes into contact with the transmission line extending from the ROM,
   a connection member which is electrically connected to the data writing unit, and
   a substrate comprising a connection line through which the contact member and the connection member are electrically connected.

When a commercially available data writing unit for writing data in a single part ROM is connected to the ROM mounted on the target board, there may occur a problem that the power current supplied from the data writing unit to the target board becomes insufficient for writing data in the ROM mounted on the target board.

When such a commercially available data writing unit is used, a heavy drive load is applied to the data writing unit, so that there may occur a problem that normal data writing in the ROM cannot be carried out.

Therefore, in the above-mentioned data writing system of the present invention, the substrate is disposed between the ROM mounted on the target board and the data writing unit, whereby when the power current supplied to the target board becomes insufficient, or when the drive load on the data writing unit is excessively large, there can be provided circuits and electronic parts for solving these problems on the substrate. For instance, in order to reduce the drive load on the data writing unit, there can be provided a buffer in the transmission line between the data writing unit and the ROM.

In the data writing system of the present invention, the transportation unit may be constructed so as be capable of transporting a plurality of the target boards to each predetermined position thereof, whereby the connection unit can electrically connect the data writing unit and the ROM mounted on each target board transported to each predetermined position.

In this data writing system, data can be simultaneously written in at least one ROM mounted on each of a plurality of target boards by a single data writing operation.

Each of the plurality of the target boards may mount thereon the same ROMs or different ROMs.

When data writing is carried out in different ROMs, it is preferable that the ROMs have the same capacity. The positions of the ROMs mounted on each target may be different.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Other features of this invention will become apparent in the course of the following description of exemplary embodiments, which are given for illustration of the invention and are not intended to be limiting thereof.

A specific example of the data writing system of the present invention which is capable of writing data in a flash ROM, which is one of electrically rewritable ROMs, mounted on a printed circuit board which serves as a target board, will now be explained in detail.

Figure 1:
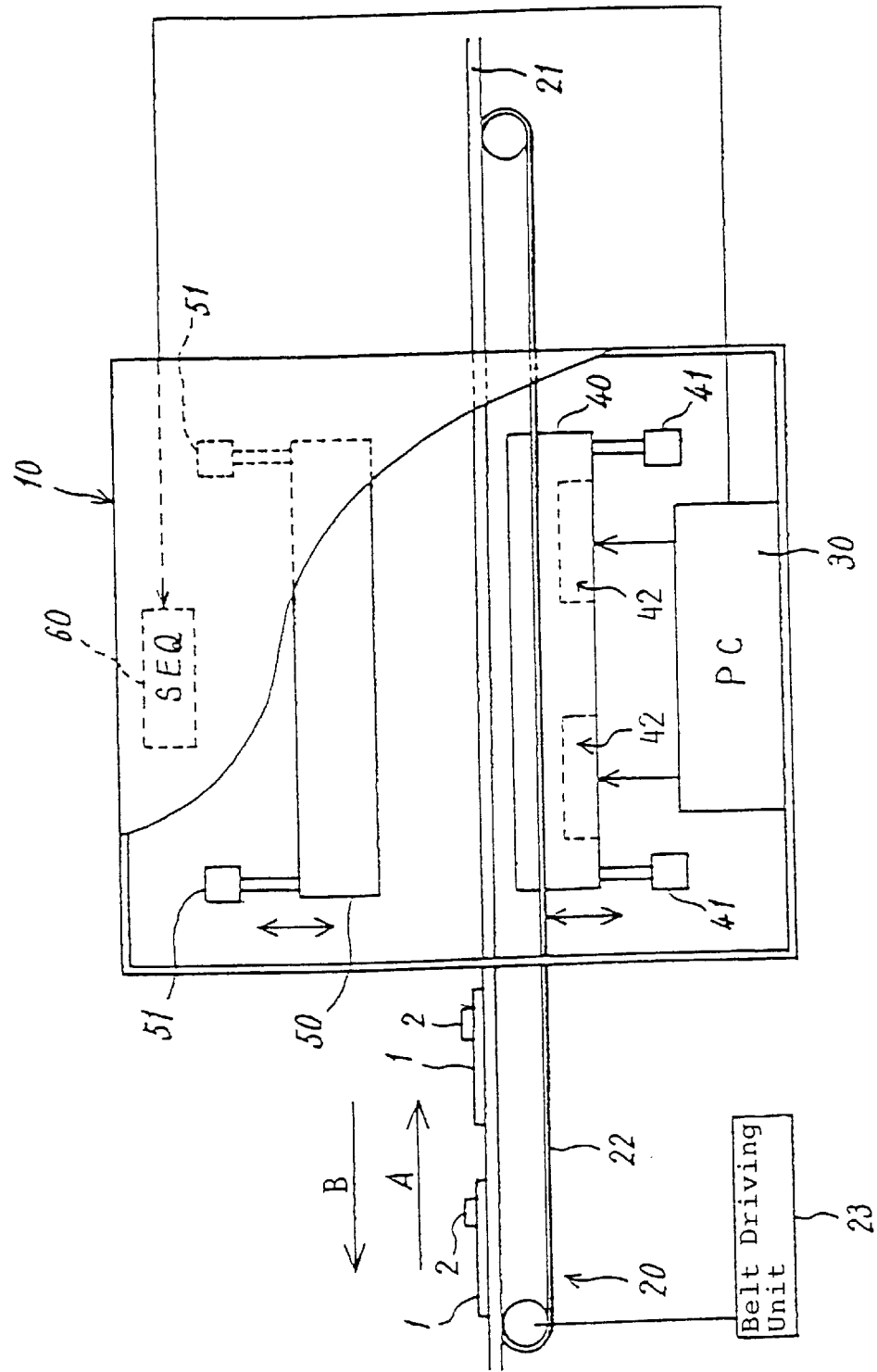
FIG. 1 is a schematic cross-sectional view of the structure of an example of a data writing system of the present invention.

FIG. 1 is a schematic overall view of the structure of the data writing system.

This data writing system comprises:
   a data writing operation box 10 in which a data writing operation is carried out in a flash ROM 2 mounted on a printed circuit board 1, a transportation unit 20 for transporting the ROM 2 mounted printed circuit board 1 into the data writing operation box 10 and transporting the printed circuit board 1 out of the data writing operation box 10 after the data writing operation, a computer (PC) 30 which serves as writing control means for controlling two ROM writers 42 which serve as a data writing unit, and a sequencer (SEQ) 60 for controlling each part and each unit of this data writing system.

The data writing operation box 10 includes:

a data writing section 40 which is positioned vertically below the printed circuit board 1 which has transported to a predetermined position, a press section 50 which is positioned vertically above the printed circuit board 1, and moving mechanisms 41 and 51 for attaching or detaching the data writing section 40 and the press section 50 to or from the printed circuit board 1.

The transportation unit 20 is provided with a guide rail 21 for guiding an end portion of the printed circuit board 1, which end portion is directed to the direction normal to the transportation direction, a transportation belt 22 for transporting the printed circuit board 1 in the direction of the arrow A in FIG. 1, and a belt driving unit 23 for driving the transportation belt 22.

The belt driving unit 23 drives the transportation belt 22 by the sequencer (SEQ) 60 which is subjected to remote control by the computer 30, so that the printed circuit board 1 is transported along the guide rail 21.

The computer 30 stores a program for controlling the transportation operation for transporting the printed circuit board 1 to each portion, and the data writing operation.

The sequencer 60 controls the belt driving unit 23 of the transportation unit 20, and the moving mechanisms 41 and 51 for moving the data writing section 40 and the press section 50.

Each of the ROM writers 42 is connected by a cable to the computer 30 through a hub (not shown), and controlled by the above-mentioned program.

In this example, the sequencer (SEQ) 60 and the computer 30 are connected through RS237C. The computer 30 and the ROM writers 42 are connected through Ethernet cables. Thus, a LAM (Local Area Network) may be constructed. Other connection methods can be used in this example.

The structure of the printed circuit board 1 will now be explained.

Figure 2A:
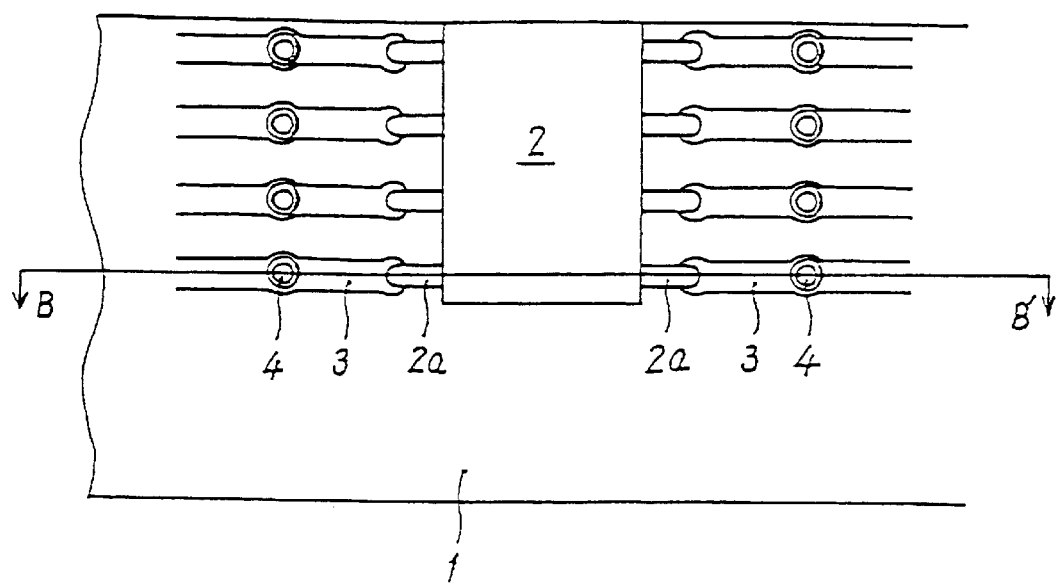
FIG. 2A is an enlarged partial plan view of a flash ROM and neighboring parts thereof mounted on a printed circuit board for use in the present invention.

FIG. 2A is a schematic partially enlarged view of the printed circuit board 1, including a neighborhood of the flash ROM 2. On the printed circuit board 1, there are printed signal lines such as an address bus for transmitting address data to the flash ROM 2, a data bus for transmitting writing data and read data, a control signal line for transmitting control signals such as read signals and write signals, and a chip enable signal line for transmitting chip enable signals.

The leads 2a of the flash ROM 2 are soldered to these signal lines 3, which constitute a transmission line, and mounted on the printed circuit board 1.

In the printed circuit board 1, there is formed a through-hole 4 in each of the signal lines 3 which extend from the flash ROM 2, which through-hole 4 is used as a test pad.

Figure 2B:
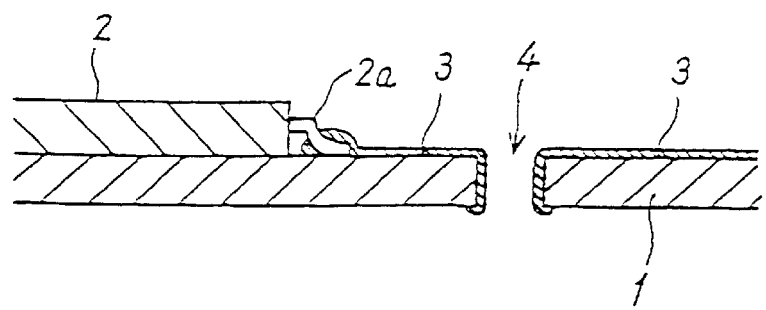
FIG. 2B is a cross-sectional view of the flash ROM and neighboring parts thereof mounted on the printed circuit board shown in FIG. 2A, taken on line B—B' in FIG. 2A.

FIG. 2B is a cross-sectional view of FIG. 2A, taken on line B—B' in FIG. 2A. As shown in FIG. 2B, the inner wall portion of the through-hole 4 and the peripheral portion of the opening of the through-hole 4 on the back side thereof are made of an electroconductive material which is in contact with the signal line 3. The through-hole 4 constitutes a contact portion with which a contact terminal 45b of the data writing section 40, which will be described in detail below, comes into contact.

Figure 3:
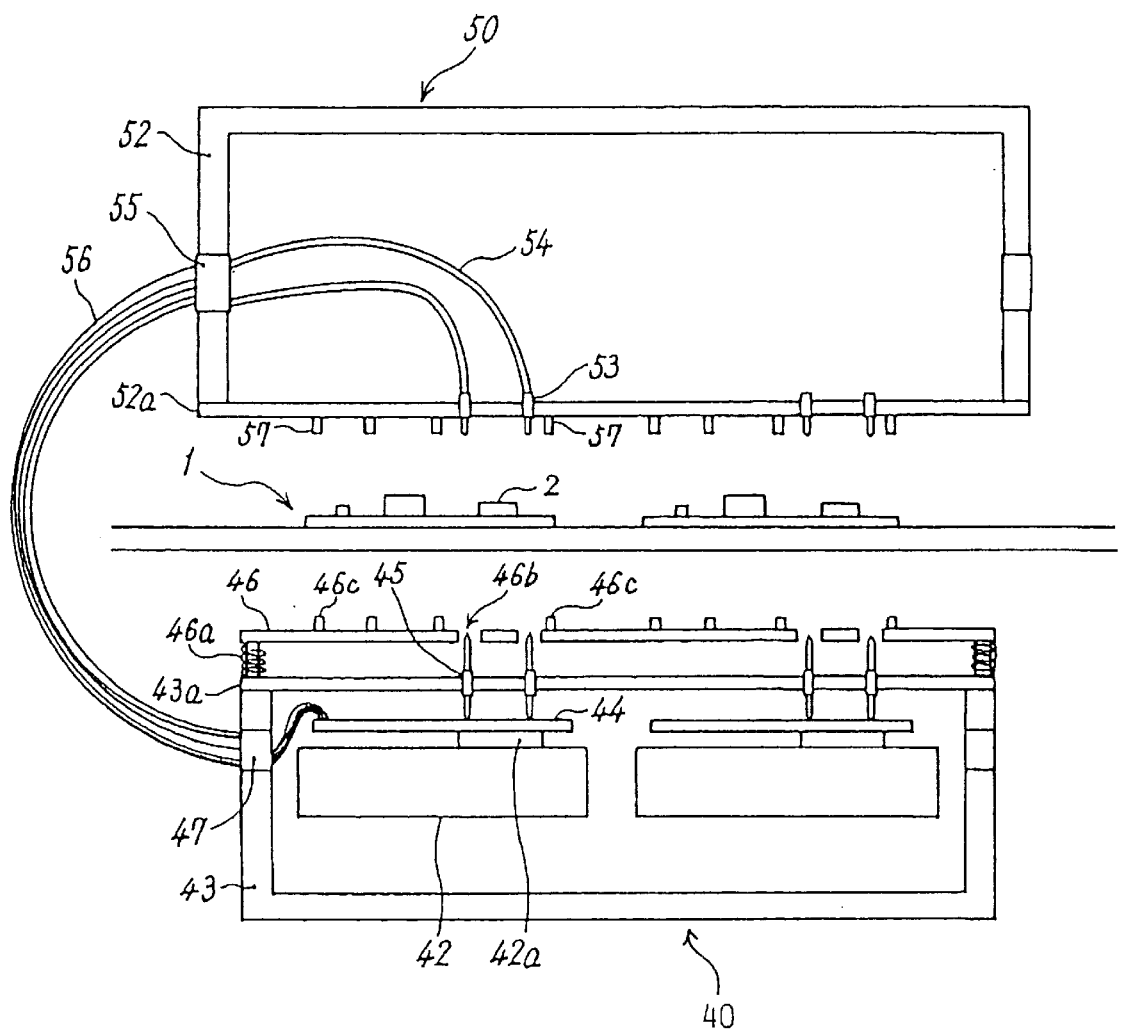
FIG. 3 is a schematic cross-sectional view of a data writing section and a press section provided in a data writing operation box for use in the data writing system of the present invention.

FIG. 3 is a schematic cross-sectional view of the inner structures of the data writing section 40 and the press section 50.

The data writing section 40 comprises a casing 43 in which two ROM writers 42 are disposed. Each of the ROM writers 42 is a data writing unit for writing data in a single part ROM. As the ROM 42, commercially available inexpensive ROM writer, for example, a ROM writer (Trademark "AF9709" made by Ando Electric Company, Ltd.) can be employed. The ROM writer 42 is provided with two ROM sockets 42a, each with a different pin number, at the upper portion thereof. The data writing can be carried out, using one of these ROM sockets 42a.

In the ROM socket 42a, there is mounted a jig board 44 which constitutes the substrate of the connection unit. At a lower portion of the jig board 44, there is provided a connector which can be connected to the ROM socket 42a. The connector is mounted with each terminal of the connector being fixed to the ROM socket 42a. An opposite end portion of each terminal of the connector to the end portion thereof connected to the ROM socket 42a extends up to the upper surface side of the jig board 44 and is connected to the signal line serving as the transmission line printed on the upper surface of the jig board 44.

Each signal line of the ROM socket 42a, corresponding to each terminal mentioned above, extends to a portion right under each through-hole 4 of the printed circuit board 1, when the printed circuit board 1 is transported by the transport unit 20 up to the predetermined writing position. In the jig board 44, there are formed the same through-holes as those in the printed circuit board 1. The through-holes of the jig board 44 are formed in the vertical direction and at the same positions as those of the through-holes 4 formed in the printed circuit board 1.

In the signal lines of the jig board 44, there are provided buffers. The buffers are provided midway through the address bus and the data bus through which various data output from the ROM writer 42 is transmitted, the control signal line, and the chip enable signal line. The buffers are composed of (1) a one-way bus buffer provided midway through the address bus, the control signal line and the chip enable signal line, and (2) a two-way bus buffer provided midway through the data bus. By the provision of the buffers in this manner, the drive load on the ROM writer 42, when signals are input to the printed circuit 1, can be reduced.

Furthermore, the jig board 44 is provided with a power voltage follow-up supply portion for supplying power to the printed circuit board 1, following up the power voltage from the ROM writer 42, in order to make up for the power supply to the printed circuit board 1 from the ROM writer 42. The above buffers are also provided with power by the power voltage follow-up supply portion.

Figure 4:
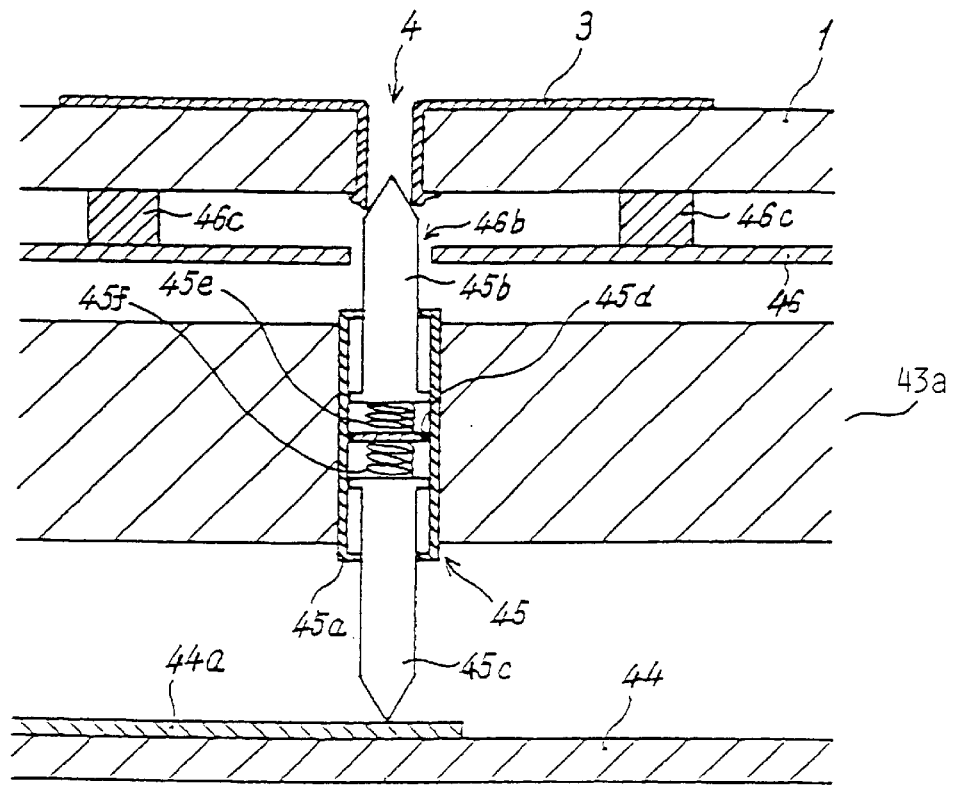
FIG. 4 is a schematic cross-sectional view of a contact pin provided in an upper plate of a casing of the data writing section shown in FIG. 3.

FIG. 4 shows a cross-sectional view of a contact pin 45 serving as a contact member provided at an upper plate 43a of the casing 43. The contact pin 45 is disposed at a place corresponding to the position of each through-hole 4 of the printed circuit board 1 which is situated at the writing position.

FIG. 4 shows the state in which the contact pin 45 is in contact with the through-hole 4 of the printed circuit board 1. The contact pin 45 is disposed with a base portion 45a thereof being fixed to the upper plate 43a, and with a contact terminal 45b and a contact terminal 45c thereof being provided so as to protrude in an upper direction and a lower direction, respectively. The contact pin 45 is vertically symmetrical in shape with respect to a partition plate 45*d* which is provided at the center of a vertical portion inside the base portion 45*a*. A top portion of each of the contact terminals 45*b* and 45*c* is formed into a conical shape. A spring 45*e* is provided between the other end of the contact terminal 45*b* and the partition plate 45*d*, and a spring 45*f* is provided between the other end of the contact terminal 45*c* and the partition plate 45*d*, in such a manner that the contact terminal 45*b* and the contact terminal 45*c* are urged so as to protrude from the base portion 45*a*.

Each contact terminal 45*c*, which protrudes downward, is always in contact with a through-hole (not shown) of the corresponding signal line 44*a* printed on the jig board 44.

As shown in FIG. 3 and FIG. 4, above the casing 43, there is disposed a printed circuit board supporting plate 46 for supporting the printed circuit board 1, with the printed circuit board 1 being held between the printed circuit board supporting plate 46 and the above-mentioned press section 50. The printed circuit board supporting plate 46 is made so as to be vertically movable from the casing 43.

As shown in FIG. 3, the printed circuit board supporting plate 46 is urged by a spring 46*a* so as to be moved away from the upper plate 43*a* of the casing 43.

Furthermore, in the printed circuit board supporting plate 46, there are formed through-holes 46*b* through which the contact terminal 45*b* of the contact ping 45, which protrudes upward, can pass, at the positions of each contact terminal 45*b*.

As shown in FIG. 3, the printed circuit board supporting plate 46 is normally situated by the urging of the spring 46*a* at a position where the top end of the contact terminal 45*b* does not protrude from the printed circuit board supporting plate 46.

On the upper surface of the printed circuit board supporting plate 46, there is formed a plurality of contact portions 46*c* which come into contact with the back side of the printed circuit board 1 at a plurality of points corresponding to the number of the contact portions 46*c*. These contact portions 46*c* are situated at the same positions as those of contact portions 57 of the press section 50 which will be described later.

The structure of the press section 50 disposed inside the data writing operation box 10 will now be explained.

As shown in FIG. 3, on a lower plate 52*a* of a casing 52 of the press section 50, there are formed contact pins 53 which are similar to the contact pins 45 of the data writing section 40.

The contact pins 53 are disposed with the base portions thereof being fixed to a lower plate 52*a* of the casing 52, and protrude downward from the lower plate 52*a*. On the lower plate 52*a*, there is formed a plurality of contact portions 57 which come into contact with a front side of the printed circuit board 1 at a plurality of points corresponding to the number of the contact portions 57. These contact portions 57 serve as spacers for preventing the lower plate 52*a* from coming into contact with a number of electronic parts mounted on the printed circuit board 1, and come into contact with board portions of the printed circuit board 1 where such electronic parts are not mounted, so that even when the press section 50 applies pressure to the printed circuit board 1, the lower plate 52 does not come into contact with the electronic parts mounted on the printed circuit board 1. The printed circuit board 1 is held at the board portions thereof between the contact portions 57 and the contact portions 46*c* of the data writing section 40.

Inside the casing 52, cables 54 connected to the contact pings 53 are connected to a connector 55 attached to a side plate of the casing 52. The connector 55 is connected to a connector 47 attached to a side plate of the casing 43 of the data writing section 40 through cables 56.

The connector 47 is connected to the signal line 44*a* mounted on the jig board 44 in the casing 43. By this structure, each contact pin 53 of the press section 50 is connected to each terminal corresponding to the ROM socket 42*a* of the ROM writer 42, so that the writing data output from the ROM socket 42*a* at the time of writing data is transmitted to the flash ROM 2 through the two transmission routes, that is, the transmission route passing through the contact pins 45, and the transmission route passing through the contact pins 53 of the press section 50.

Furthermore, at the time of writing data, the printed circuit board 1 is supported by being held between the contact portions 57 formed on the lower plate 52*a* of the press section 50 and the contact portions 46*c* of the data writing section 40.

Unless the printed circuit board 1 is held horizontally when supported, there is a risk that the contact terminals 45*b* for transmitting data does not securely come into contact with the ROMs on the printed circuit board 1. Therefore, it is preferable that these contact portions 57 and the contact portions 46*c* corresponding thereto be such positioned that the contact portions 57 and 46*c* uniformly come into contact with the printed circuit board 1 in its entirety. In order to achieve this, in the portions where the contact pins 45 and 53 are densely present, it is necessary to locate a number of contact portions 46*c* and 57 around the portions.

The data writing operation in the data writing system of the present invention will now be explained.

A pair of printed circuit boards 1 in which no data printing has not yet been done are carried out from a printed circuit holding section (not shown) and set in the transportation unit 20 as shown in FIG. 1, and a data writing operation is initiated with the sequencer (SEQ) 60, the ROM writers 42 and other units being controlled by the computer 30. More specifically, to begin with the computer 30, which carries out a program for the data writing operation, controls the sequencer (SEQ) 60, and the sequencer (SEQ) 60 then controls the belt driving unit 23 of the transportation unit 30, so that the transportation belt 22 is driven. The two printed circuit boards 1 are then moved along the guide rail 21 and transported into the data writing operation box 10. These printed circuit boards 1 are brought into contact with a stopper (not shown). When the positions of the printed circuit boards 1 for writing data are then fixed as shown in FIG. 3, a sensor (not shown) for detecting that the printed circuit boards 1 have reached their respective data writing positions works, so that the driving of the belt driving unit 23 is stopped under the control of the sequencer (SEQ) 60.

Figure 5:
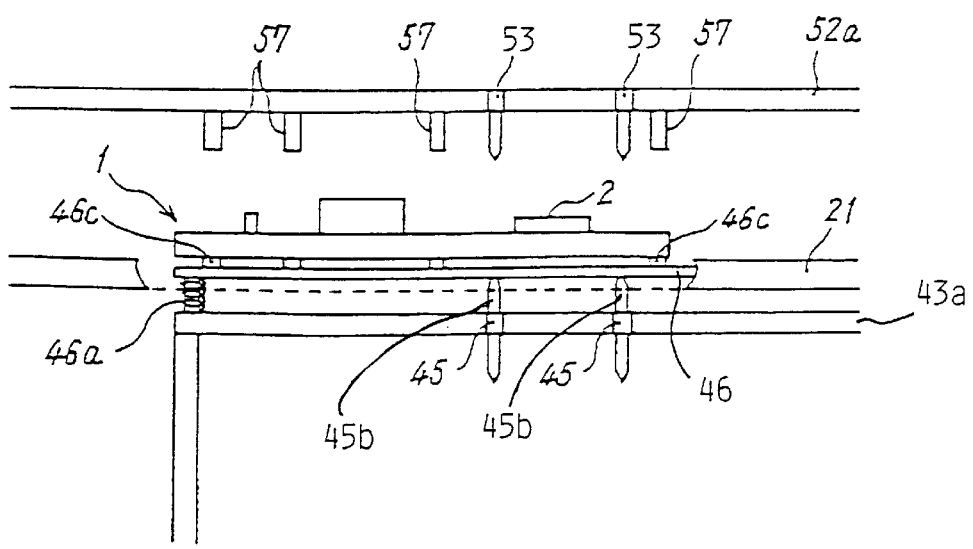
FIG. 5 is a schematic cross-sectional view of contact portions of a data writing unit of the data writing system of the present invention, which contact portions are in contact with a printed circuit board.

The sequencer (SEQ) 60 controls the moving mechanism 41 and moves the data writing section 40 upward, whereby the contact portions 46*c* on the printed circuit board supporting plate 46 of the data writing section 40 are brought into contact with the back side of the printed circuit board 1, so that the printed circuit board 1 is positioned in a floating state slightly above the guide rail 21 as shown in FIG. 5, and the data writing section 40 is stopped at the position where the printed circuit board 1 is in the above-mentioned state. In this state, the top end of the contact terminal 45*b* of each contact pin 45 is not protruding from the upper surface of the printed circuit board supporting plate 46.

Thereafter, the sequencer (SEQ) 60 controls the moving mechanism 51 and moves the press section 50 downward, whereby the contact portions 57 on the lower plate 52*a* of the press section 50 are brought into contact with the printed circuit board 1 which is positioned in a floating state slightly above the guide rail 21, and push the printed circuit board 1 downward.

Thus, the position of the printed circuit board 1 is again fixed on the guide rail 21. At this moment, the contact terminals of the contact pins 53 provided on the lower plate 52a are in contact with the through-holes 4 formed in the printed circuit board 1.

The printed circuit board 1, which is pushed downward by the press section 50, pushes downward the printed circuit board supporting plate 46 which is urged upward by the spring 46a, in such a direction that the printed circuit board supporting plate 46 is caused to draw near the upper plate 43a of the casing 43. As a result, as shown in FIG. 4, the contact terminal 45b of the contact pin 45 which is fixed to the upper plate 43a is caused to protrude from the through-hole 46b of the printed circuit board supporting plate 46, and the top end of the contact terminal 45b is brought into contact with the through-hole 4 of the printed circuit board 1.

In the case where a CPU which can constitute a bus master is mounted on the printed circuit board 1 on which the flash ROM 2 in which data is to be written is mounted, the flash ROM 2 is made so as to be in an externally controllable state, with the CPU be made so as to be in a sleep state.

More specifically, the same through-holes as the above-mentioned through-holes 4 are formed in a sleep signal line extending from the CPU, and contact pins which can be brought into contact with the through-holes are formed in the data writing section 40 and the press section 50 in the same manner as the above-mentioned contact pins 45 and 53. Thus, with these pins being grounded, the above-mentioned sleep signal line is placed on an L level, whereby the CPU is made so as to be in a sleep state.

When the contact pin 45 of the data writing section 40 and the contact pin 53 of the press section 50 come into contact with the through-hole of the printed circuit board 1, the computer 30 transmits to each ROM writer 42 a data writing initiation signal for having each ROM writer 42 start data writing. The ROM writer 42, upon receiving the data writing initiation signal, performs the same data writing operation as that for a single part ROM.

Specifically, the presence of the flash ROM 2 in which data is to be written is checked. More specifically, device codes which are electronic signature codes recorded in the flash ROM mounted on the printed circuit board 1 are requested for checking the presence of the flash ROM 2, and judgement is made as to the presence of the flash ROM 2.

In the case where MBM29LV200T/200B (made by Fujitsu Ltd.) is used as the above-mentioned flash ROM 2 in the request for the device codes and the judgement thereof, the input level of each address bus is set in accordance with the setting conditions of the electronic signature code list of the flash ROM 2 as shown in the following TABLE 1:

TABLE 1

| Type | | A12–A16 | A6 | A1 | A0 | A$_{-1}$ | Code (HEX) |
|---|---|---|---|---|---|---|---|
| Manufacture Codes | | X | V$_{1L}$ | V$_{1L}$ | V$_{1L}$ | V$_{1L}$ | 04H |
| Device Codes | MBM29-LV200T | Byte Word | X | V$_{1L}$ | V$_{1L}$ | V$_{1H}$ | V$_{1L}$ X | 3BH 223BH |
| | MBM29-LV200B | Byte Word | X | V$_{1L}$ | V$_{1L}$ | V$_{1H}$ | V$_{1L}$ X | BFH 22BFH |

X: "H" or "L"

Figure 6:
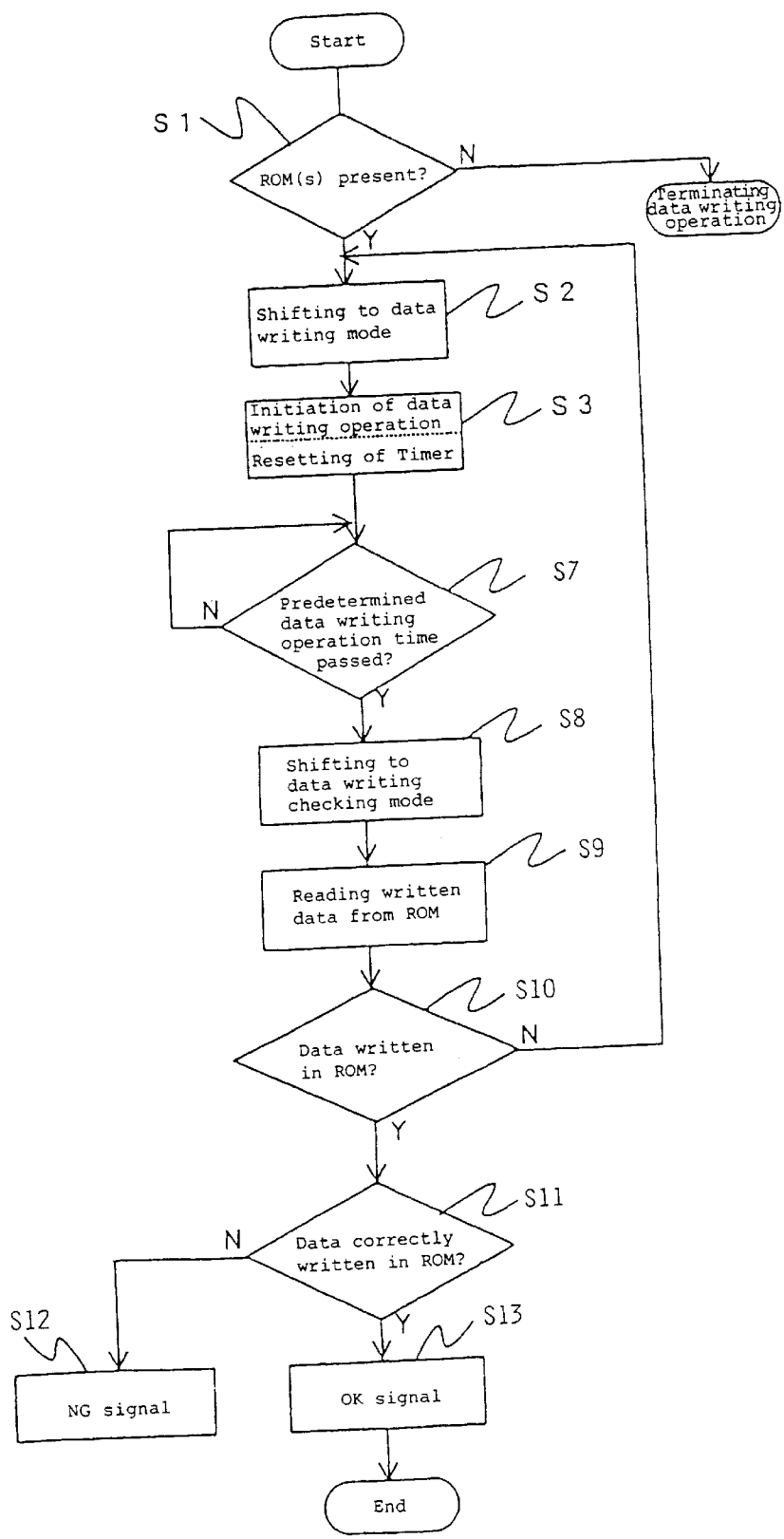
FIG. 6 is a block diagram of a data writing operation of the data writing system of the present invention, in which data writing is successively carried out in each of flash ROMs mounted on a printed circuit board.

With reference to FIG. 6, in this example, whether or not the flash ROM 2 is present is judged by checking whether or not the requested device codes can be received (S1). Alternatively, the presence of the flash ROM 2 can be judged by requesting other electronic signature codes such as manufacture codes and checking whether or not the requested electronic signature codes can be received.

When it is judged that the flash ROM 2 is present, a chip enable signal is output to the flash ROM 2. This chip enable signal is transmitted to the flash ROM 2 from the two contact pins 45 and 53 through the signal line 3 on the printed circuit board 1, so that a chip enable terminal of the flash ROM 2 is placed at an L level, whereby the flash ROM 2 is made data writable, and the data writing system shifts to a data writing mode, with write signals and other signals being enabled (S2).

On the other hand, when it is judged that the flash ROM is not present, the data writing operation is terminated.

At the same time as the shifting to the data writing mode, a timer in which a predetermined writing operation time is set is reset and then data writing is initiated (S4). The ROM writer 42 then successively writes predetermined data in the flash ROM 2 from predetermined addresses.

In the course of the above-mentioned data writing operation, the above-mentioned timer is checking whether or not the predetermined data writing operation time has passed (S7). When it is judged that the predetermined data writing operation time has passed and all the data has been written, the data writing system shifts to a data writing checking mode in which the data written in the flash ROM 2 is read out, with the read signals and other signals being enabled (S8).

Then the data written in the flash ROM 2 is read out (S9).

Based on the data read from the flash ROM 2, it is judged whether or not the writing data is written in the flash ROM 2 (S10). In step (S10), when it is judged that the writing data is not written in the flash ROM 2, the procedure is returned to the above-mentioned S2.

When it is judged that the writing data is written in the flash ROM 2, the written data read from the flash ROM 2 and the writing data are compared to check whether or not the writing data is correctly written in the flash flash ROM 2 (S11), and at the same time, a checksum is calculated.

When it is judged that the writing data is not correctly written in the flash ROM 2, an NG signal is transmitted to the computer (PC) 30, while when it is judged that the writing data is correctly written in the flash ROM 2, an OK signal is transmitted to the computer (PC) 30.

A problem may occur that even though the data has been correctly written in the flash ROM 2, it is judged that the data is not correctly written in the flash ROM 2 at the above-mentioned checking. Such a problem could be caused when data other than the written data is output from memory devices such as SRAM and ROM mounted on the printed circuit board 1 in the course of reading the written data from the flash ROM 2 for checking thereof. In order to avoid this problem, the above-mentioned memory devices such as SRAM and ROM, which are connected in parallel with the flash ROM 2, are brought to a state of high impedance to prevent the data from outputting from such memory devices in the same manner as that the state of the CPU is made the state of sleep as mentioned above.

When normal data writing operation by the ROM writer 42 has been finished, the computer 30 receives an OK signal from the ROM writer 42 and provides the sequencer (SEQ) 60 instructions to move upward the press section 50 and also to move downward the data writing section 40.

Thereafter, the sequencer (SEQ) 60 controls the belt driving unit 23 of the transportation unit 20 and drives the transportation belt 22, whereby the two printed circuit boards 1 are moved in the direction of the arrow B along the guide rail 21 and transported out of the data writing operation box 10.

On the other hand, when data writing operation by the ROM writer 42 has been finished in an abnormally state, the computer 30 receives an NG signal from the ROM writer 42 and performs the same controls as mentioned above to transport the printed circuit boards 1 out of the data writing operation box 10.

The above-mentioned data writing system of the present invention is capable of writing data in the flash ROM 2 mounted on the printed circuit board 1 without the necessity for any operators. Furthermore, the connection operation, which is conventionally performed manually, can be performed automatically in this data writing system, so that the data writing operation can be performed more quickly and at a lower cost than the conventional data writing operation.

The connection unit in the above data writing system is such structured that the data writing section 40 or the press section 50 is moved toward the printed circuit board 1 so that the contact pins 45 and 53 thereof are brought into contact with the signal line 3 of the printed circuit board 1. This structure may be altered so as to move the printed circuit board 1, thereby bringing the signal line 3 of the printed circuit board 1 into contact with the contact pins 45 and 53.

In the above data writing system, one flash ROM 2 is mounted on the printed circuit board 1. However, the present invention can also be applied in the same manner to a data writing system for writing data in a plurality of flash ROMs mounted on the printed circuit board 1.

Furthermore, in the above data writing system, one ROM writer 42 is used for writing data in one flash ROM 2 mounted on one printed circuit board 1. However, one ROM writer 42 is also capable of simultaneously writing data in at least one flash ROM 2 mounted on a plurality of printed circuit boards 1.

The data writing system for writing data in a plurality of flash ROMs mounted on the printed circuit board 1 will now be explained with reference to FIG. 7.

When a data writing initiation instruction is provided to the data writing system by the computer (PC) 30, a data writing operation is initiated. The checking as to whether or not one or more flash ROMs are present is made (S1) (refer to FIG. 7). When it is judged that one or more flash ROMs are present, the data writing system shifts to a data writing mode, with control signals such as write signals being enabled (S2).

On the other hand, when it is judged that no flash ROMs are present, the data writing system terminates the data writing operation.

Figure 7:
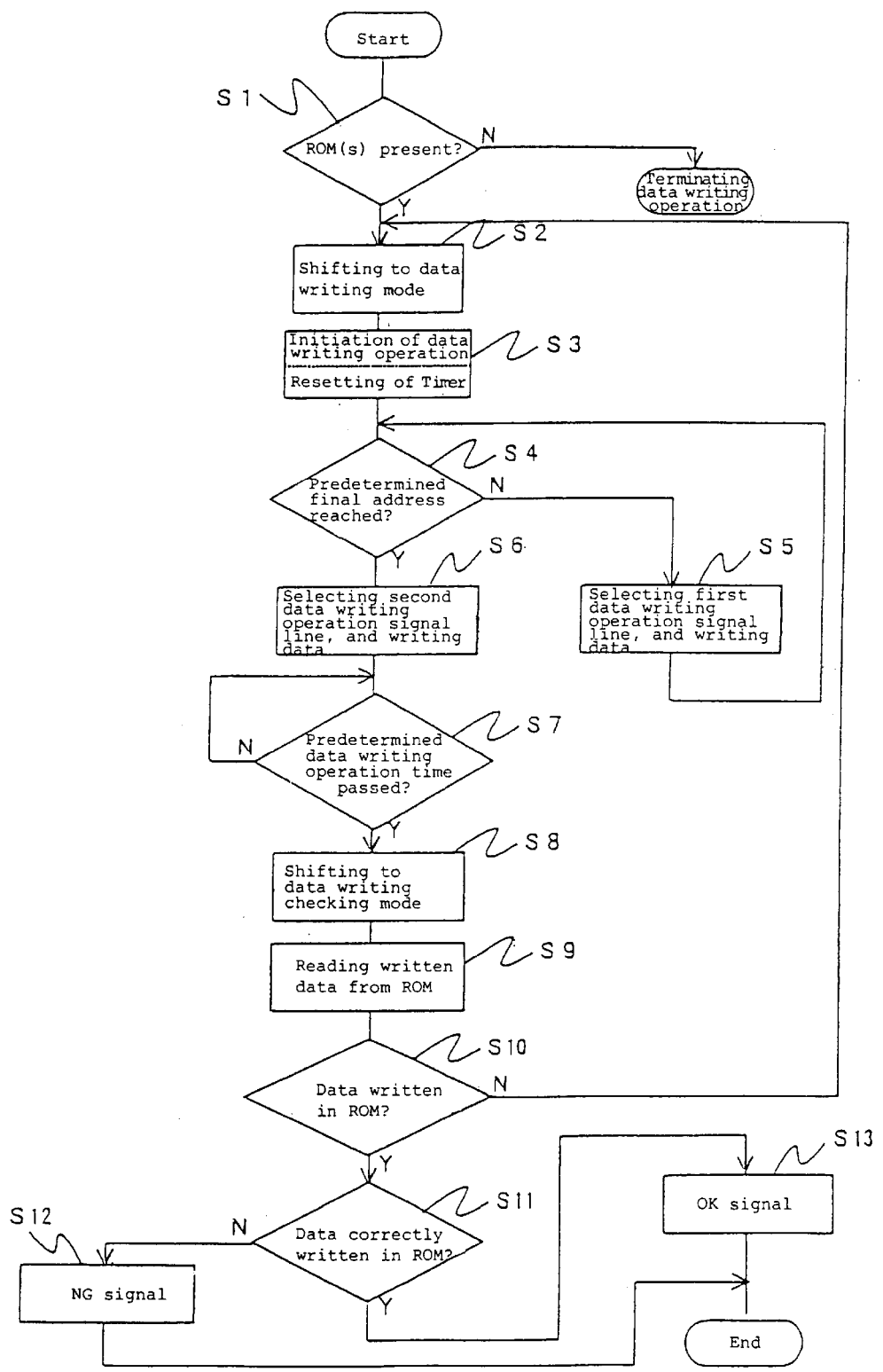
FIG. 7 is a block diagram of a data writing operation of the data writing system of the present invention, in which data writing is simultaneously carried out in a plurality of flash ROMs mounted on a printed circuit board.
Figure 8:
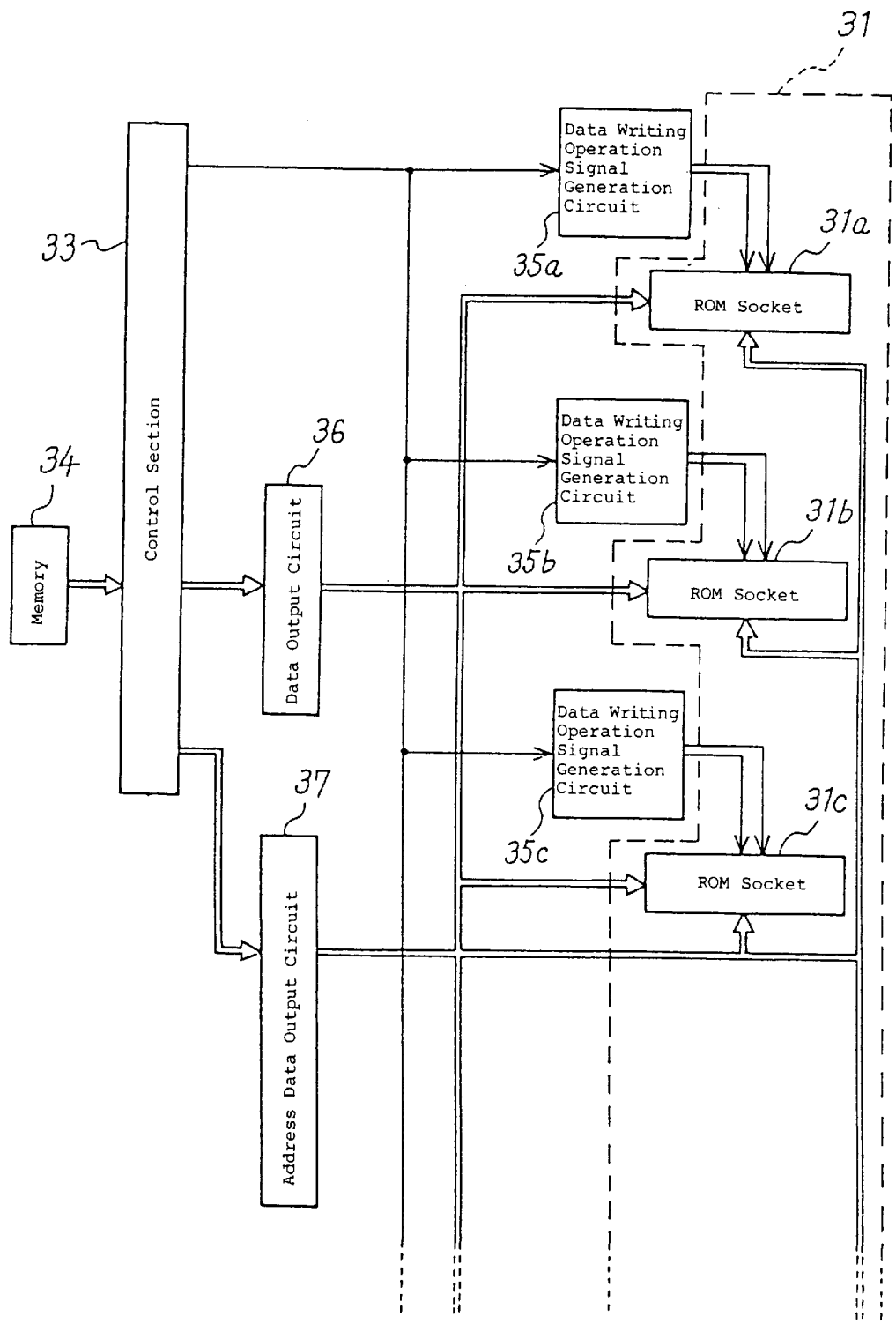
FIG. 8 is a diagram in explanation of a data writing mode of the data writing system of the present invention.

With reference to FIG. 8, after the above-mentioned shifting to the data writing mode, a control section 33 reads from a memory 34 a writing data for address 0 (zero) which is an initiation address, and outputs the read writing data to a data output circuit 36. At the same time, the control section 33 outputs 0 (zero) which is an address data to an address data output circuit 37. Also at the same time, a timer in which a predetermined writing operation time is set is reset (S3) (refer to FIG. 7).

When the data writing operation is initiated, an instruction for having a data writing operation signal generation circuit 35a generate an electric pulse is transmitted from the control section 33 to the data writing operation signal generation circuit 35a.

When this electric pulse is input to a first flash ROM mounted on a printed circuit board 1—1, the first flash ROM become writable. The writing data output from the data output circuit 36 is written in the first flash ROM through a ROM socket 31a and the above-mentioned jig board 44 (refer to FIG. 4).

Then, a writing data for address 1 (one) is written in the above-mentioned first flash ROM in the same procedure as mentioned above.

With reference to FIG. 7, in the course of the data writing operation, the control section 33, which also serves as signal output control means, judges whether or not the address data for the writing data output therefrom has reached a predetermined final address (S4).

When it is judged that the predetermined final address has not yet reached in step (S4), a data writing operation signal is output from the data writing operation signal generation circuit 35a to a first data writing operation signal line connected to the first flash ROM under the control of the control section 33 (S5), so that data is written in the first flash ROM, which is caused to be in a writable state by the data writing operation signal.

When it is judged that the writing data stored in the memory 34 has been successively written in its entirety, starting from the initiation address and reaching the predetermined final address, in the above step (S4), a data writing operation signal is output from the data writing operation signal generation circuit 35a to a second data writing operation signal line connected to a second flash ROM under the control of the control section 33 (S6), so that data is written in the second flash ROM, which is caused to be in a writable state by the data writing operation signal.

In the course of the above-mentioned data writing operation, the above-mentioned timer is checking whether or not the predetermined data writing operation time has passed (S7). When it is judged that the predetermined data writing operation time has passed, the data writing system shifts to a data writing checking mode in which control signals such as read signals are enabled (S8). Then the data written in the above-mentioned first and second flash ROMs is read out (S9).

Based on the data read from the flash ROMs, it is judged whether or not the writing data is written in the flash ROMs (S10). In step (S10), when it is judged that the writing data is not written in the flash ROMs, the procedure is returned to the above-mentioned S2.

When it is judged that the writing data is written in the flash ROMs, the written data read from the flash ROMs and the writing data are compared to check whether or not the writing data is correctly written in the flash ROMs (S11).

When it is judged that the writing data is not correctly written in the flash ROMs, an NG signal is transmitted to the computer (PC) 30, while when it is judged that the writing data is correctly written in the flash ROMs, an OK signal is transmitted to the computer (PC) 30.

Japanese Patent application No. 2000-257235 filed Aug. 28, 2000 is hereby incorporated by reference.

What is claimed is:

1. A data writing system capable of writing data in at least one electrically rewritable ROM mounted on target board, comprising:

a transportation unit for transporting said target board to a predetermined writing position at which data is to be written, a data writing unit for writing data in said ROM mounted on said target board, and a connection unit for electrically connecting said ROM mounted on said target board at said predetermined writing position and said data writing unit through at least one transmission line extending from said ROM.

2. The data writing system as claimed in claim 1, wherein said connection unit comprises a contact member which comes into contact with said transmission line, and through said contact member and said transmission line, said ROM is electrically connected to said data writing unit.

3. The data writing system as claimed in claim 1, wherein said connection unit comprises a plurality of contact members through which said connection unit is capable of electrically connecting to a plurality of connection points of said transmission line extending from said ROM, and through said transmission line and said contact members, said ROM is electrically connected to said data writing unit.

4. The data writing system as claimed in claim 3, wherein at least part of said plurality of said contact members come into contact with said same transmission line from both sides of said target board.

5. The data writing system as claimed in claim 1, wherein said connection unit comprises:

a contact member which electrically comes into contact with said transmission line extending from said ROM, a connection member which is electrically connected to said data writing unit, and a substrate comprising a connection line through which said contact member and said connection member are electrically connected.

6. The data writing system as claimed in claim 2, wherein said connection unit further comprises:

a connection member which is electrically connected to said data writing unit, and a substrate comprising a connection line through which said contact member and said connection member are electrically connected.

7. The data writing system as claimed in claim 3, wherein said connection unit further comprises:

a connection member which is electrically connected to said data writing unit, and a substrate comprising a connection line through which said contact members and said connection member are electrically connected.

8. The data writing system as claimed in claim 4, wherein said connection unit further comprises:

a connection member which is electrically connected to said data writing unit, and a substrate comprising a connection line through which said contact members and said connection member are electrically connected.

9. The data writing system as claimed in claim 1, wherein said transportation unit is capable of transporting a plurality of said target boards on which at least one electrically rewritable ROM is mounted to each predetermined position thereof, where data writing is simultaneously carried out in said at least one electrically rewritable ROM mounted on said plurality of said target boards.

* * * * *